(12) United States Patent
Tsukamoto

(10) Patent No.: US 7,137,852 B2
(45) Date of Patent: Nov. 21, 2006

(54) FIXING STRUCTURE FOR ELECTRON DEVICE

(75) Inventor: Hironori Tsukamoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/146,645

(22) Filed: Jun. 6, 2005

(65) Prior Publication Data
US 2005/0287843 A1    Dec. 29, 2005

(30) Foreign Application Priority Data
Jun. 24, 2004  (JP)  ............ P. 2004-185781

(51) Int. Cl.
*H01R 33/00* (2006.01)
(52) U.S. Cl. ................... 439/698; 362/656
(58) Field of Classification Search ........... 439/611, 439/698; 362/656, 647, 658, 659, 219
See application file for complete search history.

(56) References Cited

U.S. PATENT DOCUMENTS

| 3,909,607 | A | * | 9/1975 | Vause et al. ............ 362/296 |
| 4,303,297 | A | * | 12/1981 | Smart et al. ............. 439/650 |
| 4,482,944 | A | * | 11/1984 | Roossine et al. ........... 362/418 |
| 5,038,257 | A | * | 8/1991 | Agabekov .................... 362/219 |
| 5,180,887 | A | * | 1/1993 | Agabekov .................. 174/72 B |
| 5,260,859 | A | * | 11/1993 | Lettenmayer ............... 362/219 |
| 5,707,243 | A | * | 1/1998 | Endo et al. ................. 439/76.2 |

FOREIGN PATENT DOCUMENTS

| JP | 9-134752 | * | 5/1997 |
| JP | 2003243721 | | 8/2003 |
| JP | 2003331635 | | 11/2003 |

* cited by examiner

Primary Examiner—Neil Abrams
(74) Attorney, Agent, or Firm—Fish & Richardson P.C.

(57) ABSTRACT

The invention provides a fixing structure for an electron device that enables an electron device to be attached and removed from wiring with one touch. The structure is provided with bus bars formed from conductive plate material that are connected to a power source, and an LED which has lead electrodes fixed to the bus bars and which is supplied with electricity therefrom. Fixing portions of the bus bars are provided with position determining tabs for positioning the lead electrodes, and an elastic contacting tab that elastically holds each lead electrode. The position determining tabs and the elastic contacting tabs are formed by bending portions of the bus bars. Accordingly, there is no need to provide components separate from the bus bars. When attachment and removal is performed, the LED is pushed downward toward or lifted up from the fixing portions of the bus bars.

8 Claims, 10 Drawing Sheets

FIXING STRUCTURE FOR ELECTRON DEVICE

CROSS-REFERENCE

This application claims the benefit of Japanese patent Application No. P.2004-185781 filed Jun. 24, 2004, which is incorporated herein in its entirety.

TECHNICAL FIELD OF THE INVENTION

The present invention relates to a structure for fixing an electron device such as a light emitting device like a light emitting diode (LED) to a board, and in particular to a fixing structure that allows an electron device to be attached to and removed from a board with a single touch.

BACKGROUND OF THE INVENTION

As vehicular lamps used in automobiles or the like, lamps have been proposed that use an LED as a light source. In this type of lamp, a plurality of LEDs are fixed to a board to obtain a desired quantity of light. Electrical wiring is connected to each LED and power supplied thereto. In order to provide a simplified structure for fixing a plurality of LEDs to a board in this manner and connecting electrical wiring at the same time, a board called a bus bar or metal plate wiring is provided, which is configured from a conductive plate of metal or the like that is formed with a desired pattern to provide wiring pairs. The LEDs are fixed thereto, whereby electrode pairs of the LEDs are electrically connected to the bus bar, and electricity is supplied to the LED via the bus bar.

Japanese Patent Laid-Open Publication Nos. 2003-331635 and 2003-243721 provide examples of this type of fixing structure. In Publication 2003-331635, one of a pair of lead electrodes of an LED is inserted in a notch projection provided one of a negative-positive pair of metal plate wirings. Another lead electrode is mounted on another metal plate wiring, and a locking member is engaged from the top side of the other lead electrode into the other metal plate wiring. The lead electrode is clamped between the metal plate wiring and the locking member. Accordingly, the pair of lead electrodes of the LED are mechanically fixed to the metal plate wiring by the notch projection and the locking member, and are electrically connected to each of the negative-positive metal plate wirings.

In Publication 2003-243721, an LED is mounted on a housing of insulated material. Each negative-positive metal plate wiring is mounted on each one of a pair of lead electrodes of the LED from the top side thereof, and the metal plate wirings are then attached to the upper surface of the housing such that each lead electrode is sandwiched between the housing and the metal plate wiring. Accordingly, the pair of lead electrodes of the LED are respectively sandwiched and mechanically fixed between the housing and the pair of metal plate wirings, and are electrically connected to the respective metal plate wirings.

However, in the above-cited references, the configurations are such that the lead electrodes of the LED are sandwiched in a state in which they are in contact with the metal plate wirings. Accordingly, it is necessary to provide a separate locking member or housing in order to affix the LED. Further, when the LED is fixed to the metal plate wiring, it is necessary to perform operations such as inserting the locking member to the metal plate wiring, or attaching the metal plate wirings to the housing. In addition, when the LED needs to be removed from the metal plate wiring when the LED is replaced, or the like, operations including removing the locking member or removing the metal plate wiring must be performed. Accordingly, the devices of the cited references have a number of problems such as having an increased number of components, and requiring a complicated operation to attach and remove the LED.

SUMMARY OF THE INVENTION

In one aspect, the present invention is a fixing structure for an electron device provided with bus bars formed from conductive plate material connected to a power source, and an electron device which has lead electrodes fixed to the bus bars and which is supplied with electricity via the bus bars. The fixing portions of the bus bars are provided with elastic contacting tabs which are formed by bending portions of the bus bars, and which contact elastically and engage with peripheral portions of the lead electrodes so as to elastically hold the lead electrodes. The elastic contacting tabs enable the lead electrodes to be attached from a perpendicular direction to surfaces of the bus bars. Note that, the configuration may be such that the lead electrodes are provided with respective electrode portions with tip ends which bend in a plane direction toward the outside and which have a width dimension that is enlarged, and the elastic contacting tabs elastically hold the electrode portions. Further, it is favorable that the present invention is provided with a position determining means for positioning the lead electrodes on the bus bars, or on an insulated base that fixes the bus bars.

In an implementation of the present invention, the fixing portions provided on the bus bars are formed and configured by bending portions of the bus bars. Accordingly, there is no need to provide components separate from the bus bars as in conventional structures, whereby it is possible to provide a configuration with a minimal number of structural components. Further, when the electron device is attached to and removed from the fixing portion of the bus bar, it is only necessary to perform a one touch operation in which the electron device is pushed downwards toward or lifted upwards from the surface of the bus bars in the perpendicular direction. Accordingly, the operation is extremely simple. Moreover, the electric connection of the bus bars and the lead electrodes is achieved through elastic contact of the periphery portions of the electrode portions and the elastic contacting tabs in the plane direction. Accordingly, as compared to when the electrode portions are in surface contact with the surface of the bus bars, the contact pressure of the lead electrodes and the bus bars is increased, whereby it is possible to reduce contact electrical resistance and obtain a favorable electric connection. Moreover, the lead electrodes have the electrode portions formed with a broad width to facilitate heat dissipation. Accordingly, the lengths of the sides in the width direction of the electrode portions are long, and thus the contact dimensions of the fixing portions and the elastic contacting tabs are large, which is also favorable from the point of view of reducing electrical contection resistance. In addition, as a result of providing the position determining means on the bus bars or the insulated base, the attachment of the electron device to the fixing portion can be easily and accurately performed.

The configuration is such that the elastic contacting tabs of the present invention are in elastic contact with one periphery portion of the lead electrodes, and the lead electrodes are sandwiched between the elastic contacting tabs and the position determining tabs. Alternatively, the configuration is such that the elastic contacting tabs elastically contact the lead electrodes at facing periphery portions thereof such that the lead electrodes are sandwiched between the elastic contacting tabs.

Various other features and advantages may be readily apparent from the following detailed description, the accompanying drawings, and the claims.

BRIEF DESCRIPTION OF THE DRAWINGS

Next, embodiments of the invention will be explained with reference to the drawings, in which.

DETAILED DESCRIPTION

Figure 1:
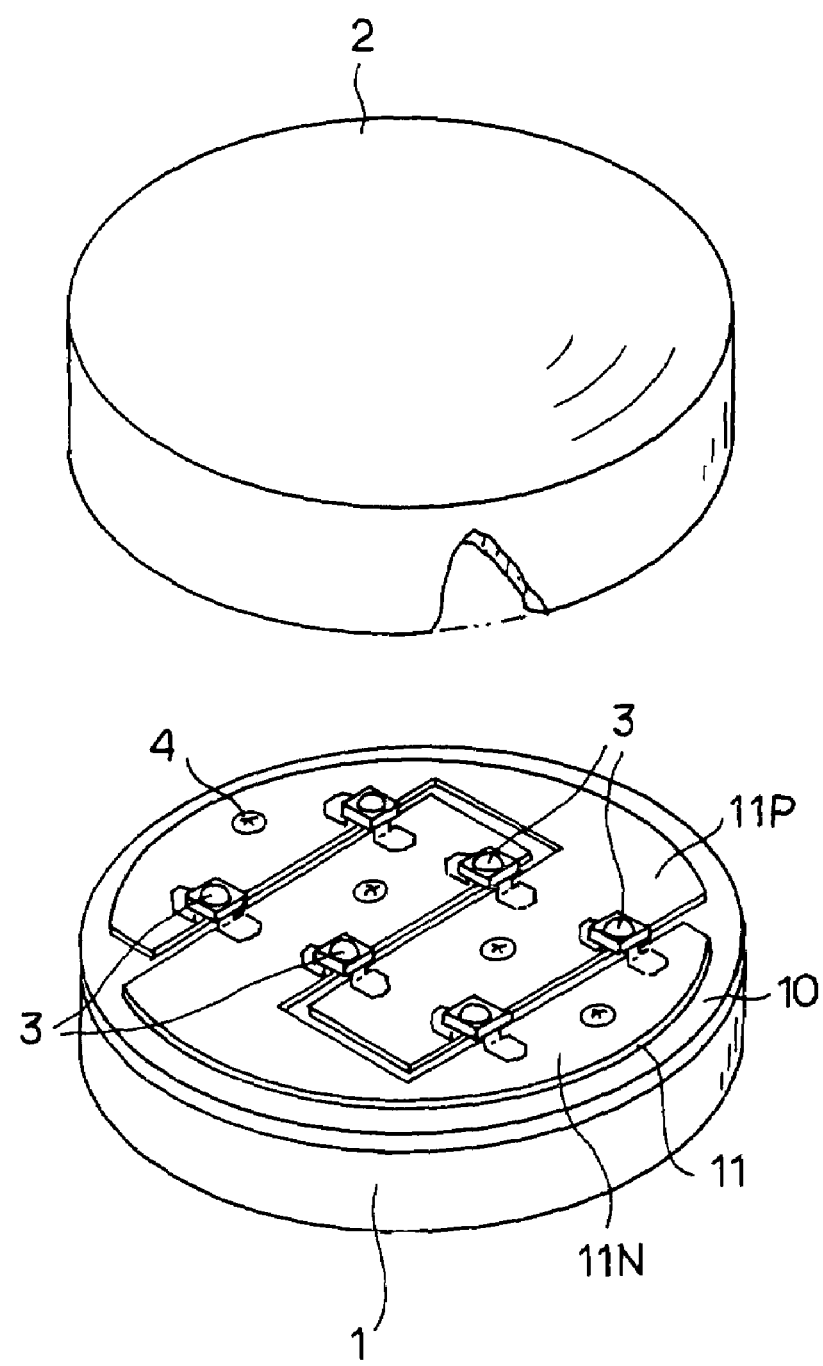
FIG. 1 is a perspective view of a lamp to which the present invention is applied.

FIG. 1 shows the external appearance of a vehicular supplementary headlamp using an electron device according to the present invention, and in particular a light emitting device that is an LED. The configuration includes a circular plate lamp base 1, a circular saucer-shaped lens 2 that is placed over the lamp base 1 to cover it, and a plurality of LEDs 3 which are mounted on the lamp base 1 and which act as light sources. A bus bar 11 machined from conductive metal plate is supported in an integrated manner on a circular base 10 of the lamp base 1 using screws 4, etc. The bus bar 11 is cut into two sections in the plane direction. A bus bar 11P on one side is supplied with positive potential of a power supply voltage from a battery, not shown (hereinafter referred to as the "positive side bus bar") and a bus bar 11N on the other side is supplied with ground potential (0V) (hereinafter referred to as the "negative side bus bar"). The LEDs 3 are mounted at respective positions at which the positive bus bar 11P and the negative bus bar 11N face each other with a tiny distance of separation and straddle over the tiny gap therebetween. A positive side lead electrode 33P and a negative side lead electrode 33N of each LED 3, described hereinafter, are placed in contact with the positive bus bar 11P and the negative bus bar 11N, respectively, and fixed in an electrically connected state.

Figure 2:
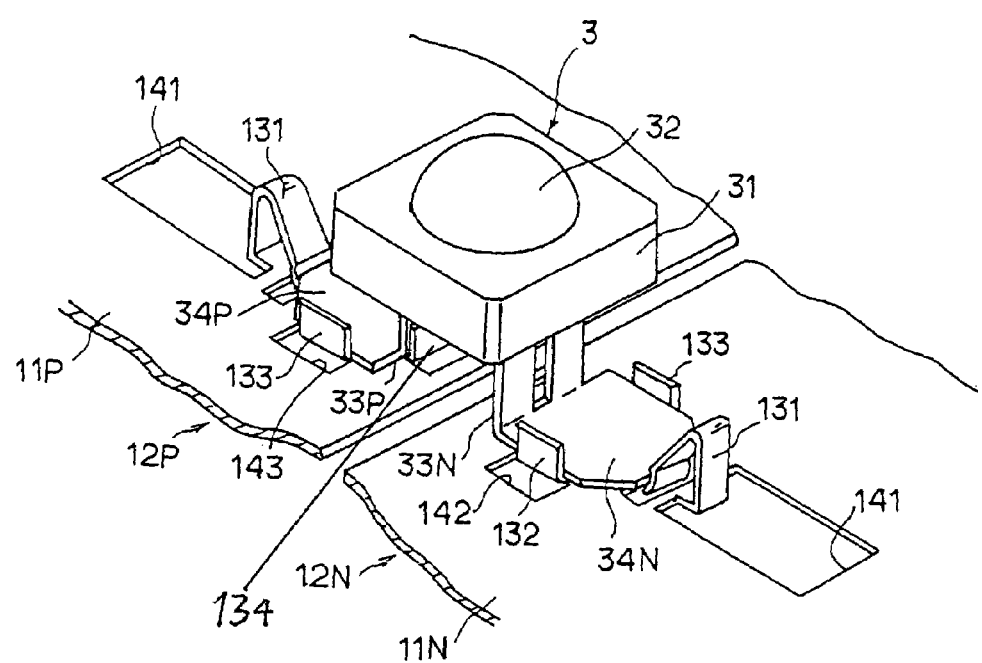
FIG. 2 is a perspective view of a fixing structure for an LED of a first embodiment.
Figure 3:
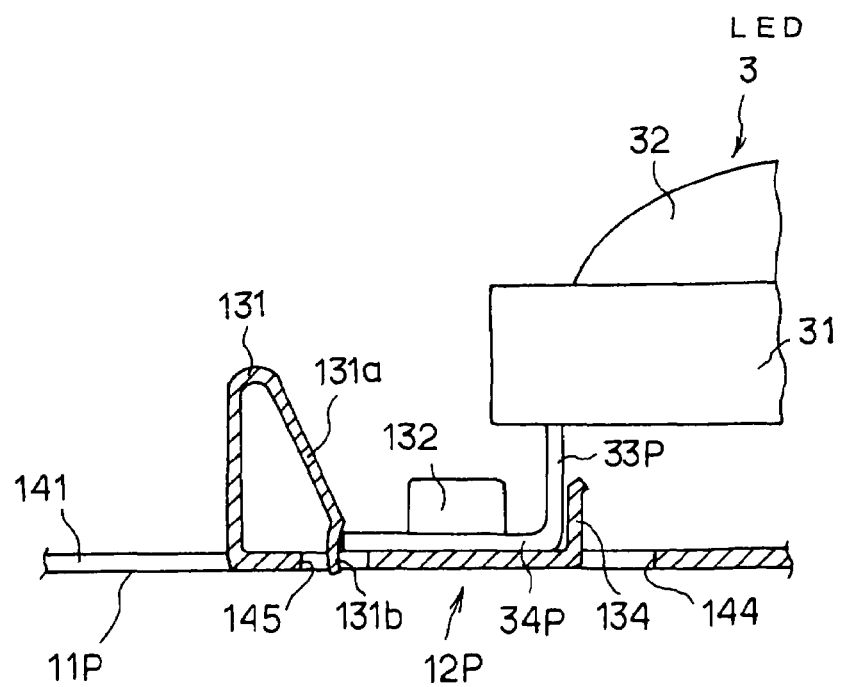
FIG. 3 is a longitudinal section view of a main portion of a fixing portion.
Figure 4:
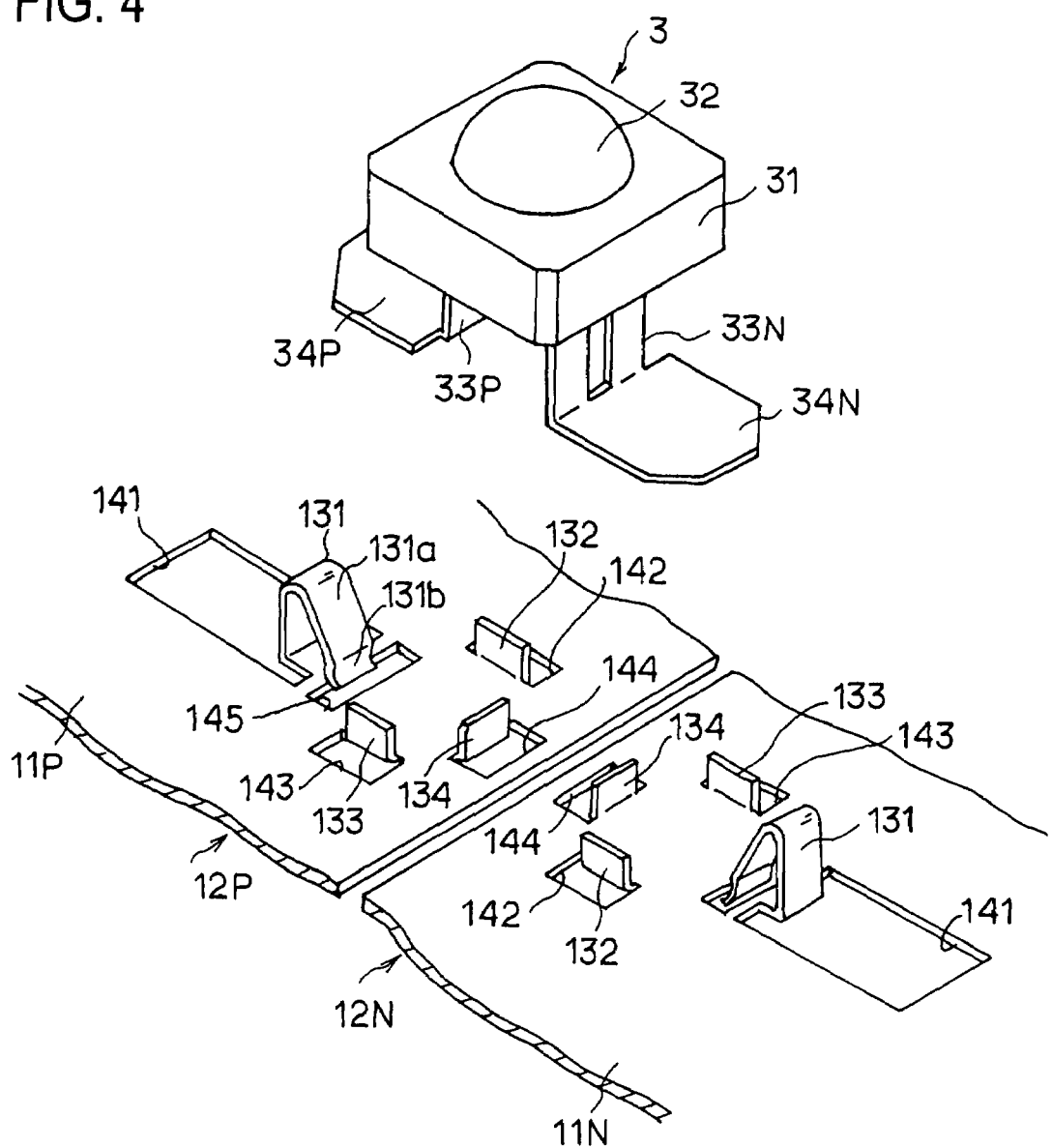
FIG. 4 is an exploded perspective view of a portion of the fixing structure of the first embodiment.

FIG. 2 is a perspective view showing a fixing portion of one of the LEDs 3 among the plurality of LEDs 3 shown in FIG. 1, and FIG. 3 is a longitudinal section view of the same. Further, FIG. 4 is a perspective view showing a state in which the LED 3 has been removed from the bus bar 11. The LED 3 houses an LED chip, not shown, and includes a package 31 with an integrated condenser lens 32 at the top surface thereof. The positive side lead electrode 33P and the negative side lead electrode 33N forming a pair are provided so as to protrude downward for a small distance from the bottom surface of the package 31, and have respective tip end portions that bend to the outward sides and extend in a horizontal direction. In order to enhance the heat dissipation effectiveness of the lead electrodes 33P and 33N, the tip ends thereof are formed with electrode portions 34P and 34N that have width dimensions that increase. In addition, in this embodiment, both corner portions of the electrode portions 34P and 34N are formed with a slight taper shape. This is because, when the LEDs 3 are made, the following manufacturing method is utilized in which: the lead electrodes of the plurality of LEDs 3 are formed as a lead frame in which the lead electrodes are connected to each other by thin width connecting tabs, not shown; and, after forming of the package 31 has been completed, the connecting tabs are cut and separated from the lead frame to obtain the individual LEDs 3.

The LED 3 is supported such that the electrode portions 34 of the pair of lead electrodes 33P and 33N are respectively engaged at fixing portions 12P and 12N provided in the positive side bus bar 11P and the negative side bus bar 11N of the bus bar 11. In order to achieve such support, a structure is provided in which the LED 3 can be attached to and removed from the surface of the bus bar 11 in a substantially perpendicular direction. The fixing portions 12P and 12N have a structure that is formed by cutting and bending the respective bus bars 11P and 11N at various locations, and are formed at positions in the positive side bus bar 11P and the negative side bus bar 11N which are symmetrically opposite and which correspond to the pair of lead electrodes 33P and 33N of the LED 3.

Here, the fixing portion 12P of the positive side bus bar 11P will be explained. Four U-shaped cut-out portions 141, 142, 143 and 144 are formed so as to surround the area at which the electrode portion 34 of the positive side lead electrode 33P of the LED 3 is fixed. The areas of the cut-out portions 141, 142, 143 and 144 are used to form four bent-up tabs 131, 132, 133 and 134 that bend upwards from the surface of the positive side bus bar 11P. Amongst these 4 bent-up tabs 131, 132, 133 and 134, the bent-up tab 131 that is located at the tip end side of the positive side lead electrode 33P is formed to be thinner and longer than the other three bent-up tabs 132, 133 and 134. Further, the bent-up tab 131 has an overall shape that is bent into a downward facing U-shape, and a movable edge 131a on the inside thereof is formed as an elastic connecting tab which has elasticity and which is capable of movement along the surface of the positive side bus bar 11P. Further, the movable edge 131a is bent to form an engagement portion 131b with a c-shaped cross section that receives and engages with a tip end periphery of the electrode portion 34 of the positive side lead electrode 33P. In addition, the movable edge 131a is positioned so as to enter into a rectangular hole 145 that neighbors on the inner side thereof. The other three bent-up tabs 132, 133 and 134 are respectively bent so as to stand substantially upright with respect to the surface of the positive side bus bar 11P. These bent-up tabs respectively contact with left and right side peripheries and a base end periphery of the electrode portion 34P of the positive side lead electrode 33P, and configure position determining tabs that fix the position of the electrode portion.

On the other side, the fixing portion 12N of the negative side bus bar 11N has the same configuration. The same reference numerals are used to denote equivalent portions to those of the fixing portion 12P of the positive side bus bar 11P. More specifically, the negative side bus bar 11N is provided with the four bent-up tabs 131, 132, 133 and 134 so as to surround the area where the electrode portion 34N of the negative side lead electrode 33N of the LED 3 is fixed, and is configured with the bent-up tab 131 which contacts with the tip end periphery of the electrode portion 34N of the negative side lead electrode 33N and which acts as an elastic contacting tab, and the three other bent-up tabs 132, 133 and 134 that act as position determining tabs.

With this configuration, when the LED 3 is fixed to the bus bar 11, the electrode portion 34P of the positive side lead electrode 33P of the LED 3 is positioned directly above the fixing portion 12P of the positive side bus bar 11P, and at the same time the electrode portion 34N of the negative side lead electrode 33N is positioned directly above the fixing portion 12N of the negative side bus bar 11N. The LED 3 is then pushed toward the surface of the bus bar 11. At this time, the position of the electrode portion 34P of the positive side lead electrode 33P is determined by the three position determining tabs 132, 133 and 134 that are placed in sliding contact with the left and right peripheries and the base end periphery. Further, the tip end periphery of the electrode portion 34P is abutted against the movable edge 131a of the elastic contacting tab 131, and is moved toward the surface of the bus bar 11P while the movable edge 131a is elastically deformed to the outside. When the tip end periphery of the electrode portion 34P engages with the engagement portion 131b of the elastic contacting tab 131, the lower surface of the electrode portion 34P abuts against the surface of the bus bar 11P. As a result, the positions of the left and right side peripheries of the electrode portion 34P of the positive side lead electrode 33P are fixed by the position determining tabs 132 and 133. The elastic force of the elastic contacting tab 131 that contacts with the tip end periphery in an elastic manner causes the base end periphery to abut against the position determining tab 134. In addition, the electrode portion 34P is sandwiched between elastic force of the elastic contacting tab 131 and the position determining tab 134 by elastic force of the elastic connecting tab 131. Further, engagement with the elastic contacting tab 131 is maintained since the tip end periphery of the electrode portion 34P is engaged with the engagement portion 131b of the elastic contacting tab 131, and thus the elastically connected state can be maintained. As a result, the electrode portion 34P of the positive side lead electrode 33P is fixed to the fixing portion 12P of the positive side bus bar 11P. Although an explanation will be omitted here, the fixing portion 12N of the negative side lead electrode 33N is fixed in the same manner to the fixing portion 12N of the negative side bus bar 11N.

Moreover, when the LED 3 is fixed in this state, the tip end peripheries of the electrode portions 34P and 34N of both lead electrodes 33P and 33N contact in an elastic manner with the elastic connecting tabs 131, and the base edge peripheries with the position determining tabs 134. Further, the electrode portions 34P and 34N of both of the lead electrodes 33P and 33N contact with the respective surfaces of the bus bar 11P and 11N, and electrical connection with each bus bar 11P and 11N is established. Accordingly, a required voltage supplied between the positive side bus bar 11P and the negative side bus bar 11N is supplied to the LED 3, whereby the LED 3 emits light.

Note that, when the fixed LED 3 is removed from the bus bar 11, the LED 3 is pulled in a perpendicular direction from the surface of the bus bar 11. The tip end peripheries of the respective electrode portions 34N and 34P of both of the lead electrodes 33P and 33N slide past the engagement portions 131b while the elastic contacting tabs 131 elastically deform to the outside. Thus, it is possible to pull the electrode portions 34P and 34N upwards from the area surrounded by the elastic contacting tab 131 and the three position determining tabs 132, 133, and 134. Accordingly, the fixed state of the LED 3 and the fixing portions 12P and 12N can be released.

In this manner, the fixing portions 12P and 12N provided in the bus bars 11P and 11N are formed and configured from portions of the bus bars 11P and 11N that are cut and lifted. Thus, there is no need to provide components that are separate from the bus bar as in conventional structures, whereby it possible to provide a configuration with a minimal number of structural components. Further, when attaching and removing the LED 3, it is only necessary to perform a one touch operation in which the LED 3 is pushed downwards toward or lifted upwards in the perpendicular direction from the fixing portions 12P and 12N of the bus bars 11P and 11N with respect to the surface of the bus bars 11P and 11N. Accordingly, the operation is extremely simple. Moreover, the electric connection of the bus bars 11P and 11N and the lead electrodes 33P and 33N is achieved through elastic contact of the tip end peripheries and the base end peripheries of the electrode portions 34P and 34N and the elastic contacting tabs 131 and the position determining tabs 134 in the plane direction. Accordingly, as compared to when the lower surfaces of the electrode portions 34P and 34N are in surface contact with the surface of the bus bars 11P and 11N, the contact pressure of the electrode portions 34P and 34N and the bus bars 11P and 11N is increased, whereby it is possible to reduce contact electrical resistance and obtain a favorable electric connection. Moreover, the lead electrodes 33P and 33N have the electrode portions 34P and 34N formed with a broad width to facilitate heat dissipation. Accordingly, the lengths of the sides in the width direction of the electrode portions 34P and 34N are long, and thus the contact dimensions of the fixing portions 12P and 12N and the elastic contacting tabs 131 are large, which is also favorable from the point of view of reducing electrical connection resistance.

Figure 5:
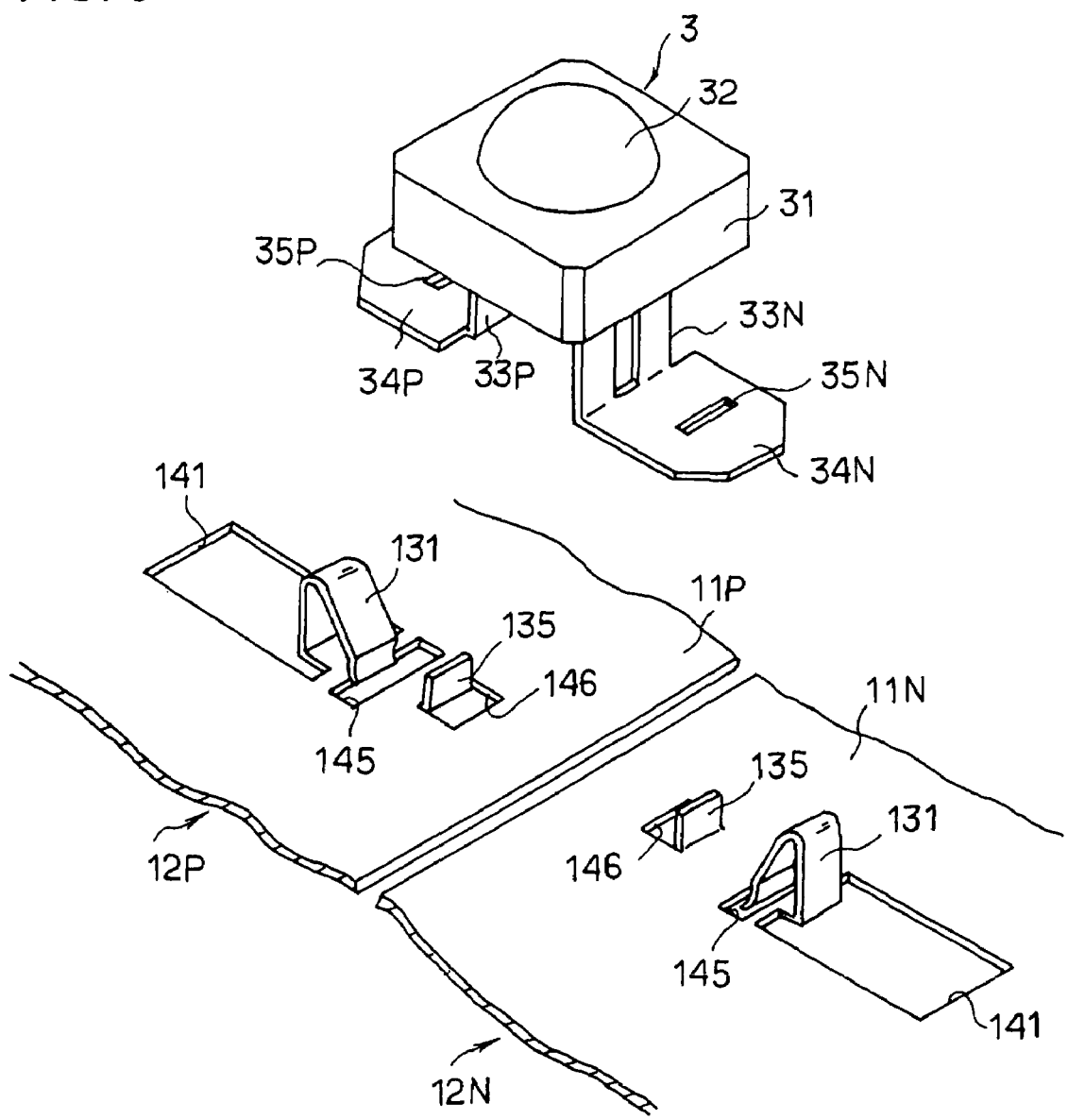
FIG. 5 is an exploded perspective view of a portion of a modified form of the first embodiment.

Note that, as shown in FIG. 5, the configuration may be such that rectangular thin grooves 35P and 35N are formed in the electrode portions 34P and 34N of the lead electrodes 33P and 33N, and position determining tabs 135 formed by cutting and bending cut-out portions 146 of the bus bars 11P and 11N are fitted in these thin grooves 35P and 35N. If this configuration is adopted, it is possible to perform plate direction positioning of the electrode portions 34P and 34N using each single position determining tab 135. Accordingly, the number of cut and bent position determining tabs in the bus bars 11P and 11N can be reduced, and it is possible to provide a simplified structure. Note that, the elastic contacting tabs 131 have the same structure as those shown in FIG. 4, and enable the electrode portions 34P and 34N to be elastically held with the position determining tabs 135.

Figure 6:
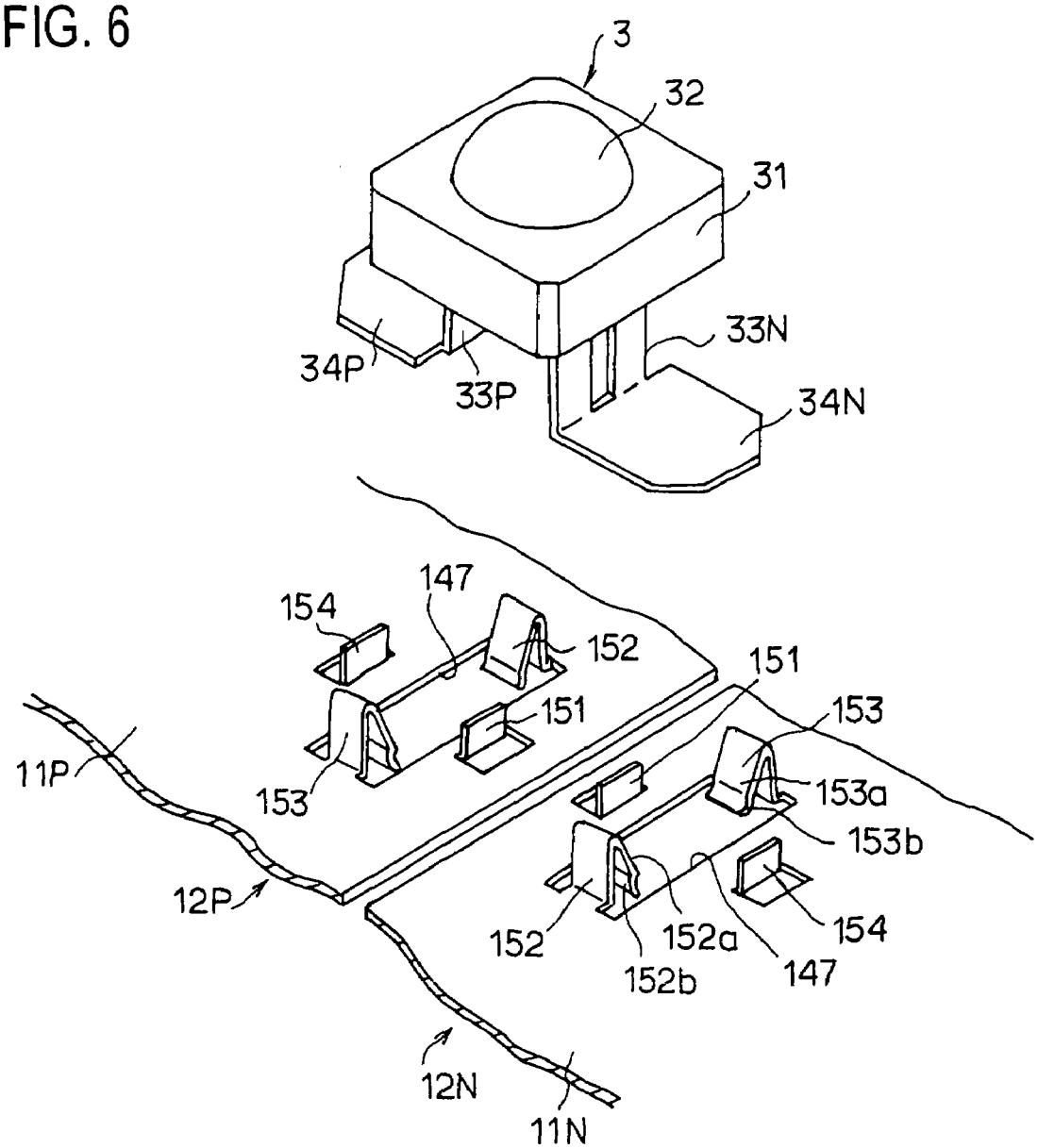
FIG. 6 is an exploded perspective view of a portion of the fixing structure of a second embodiment.

FIG. 6 is a perspective view of a fixing structure of a second embodiment. The structure of the LED 3 is the same as that of the first embodiment. Note that, portions that are equivalent to those of the first embodiment are denoted with the same reference numerals, and a repeated explanation thereof will be omitted here. In the second embodiment, the respective fixing portions 12P and 12N of the positive side bus bar 11P and the negative side bus bar 11N have a symmetrical configuration. Similarly, in order to fix the respective electrode portions 34P and 34N to the positive side lead electrodes 33 and the negative side lead electrodes 33N of the LED 3 at the fixing portions 12P and 12N, four bent-up tabs 151, 152, 153, and 154 are provided in the bus bars 11P and 11N so as to surround the respective electrode portions 34P and 34N. However, in this case, the configuration is such that the bent-up tabs 151 and 154 facing the tip end peripheries and base end peripheries of the electrode portions 34P and 34N are simply bent to stand upright from the surface of the bus bar 11P and 11N, whereby they act as position determining tabs. On the other hand, the pair of bent-up tabs 152 and 153 that face the left and right side peripheries of the electrode portions 34P and 34N are formed from the cut-out portions 147. These bent-up tabs 152 and 153 are respectively bent to have overall shapes that are downward facing U-shapes, and movable edges 152a and 153a that face the inside are formed as elastic connecting tabs which have elasticity and which are capable of movement along the surface of the bus bars 11P and 11N. Further, the movable edges 152a and 153a are bent to form engagement portions 152b and 153b with a c-shaped cross section that respectively receive and engage with the left side peripheries and the right side peripheries of the electrode portions 34P and 34N of the lead electrodes 33P and 33N. In addition, the engagement portions 152b and 153b are positioned so as to enter into the rectangular hole formed from the cut-out 147.

With this configuration, when the LED 3 is fixed to the bus bar 11, the electrode portions 34P and 34N of the positive side lead electrode 33P and the negative side lead electrode 33N of the LED 3 are positioned to face the respective fixing portions 12P and 12N of the positive side bus bar 11P and the negative side bus bar 11N. The LED 3 is then pushed toward the surface of the bus bar 11. At this time, the position of the electrode portions 34P and 33N of both the lead electrodes 33P and 33N is determined by the two position determining tabs 151 and 154 which are placed in sliding contact with the tip end peripheries and the base end peripheries. Further, the left and right peripheries are abutted against the movable edges 152a and 153a of the elastic contacting tabs 152 and 153, and are moved toward the surfaces of the bus bars 11P and 11N while the movable edges 152a and 153a are elastically deformed to the outside. When the left and right side peripheries engage with the respective engagement portions 152b and 153b of the elastic contacting tabs 152 and 153, the electrode portions 34P and 33N abut against the surfaces of the bus bars 11P and 11N. Accordingly, the positions of the tip end peripheries and the base end peripheries of the respective electrode portions 34P and 34N of the lead electrodes 33P and 33N have their positions fixed by the position determining tabs 151 and 154. The electrode portions 34P and 34N of the lead electrodes 33P and 33N are elastically held in the left-right direction by the elastic force of the elastic contacting tabs 152 and 153 that contact with the left and right side peripheries in an elastic manner. More particularly, the left and right side peripheries are engaged and held by the engagement portions 152b and 153b of the pair of elastic contacting tabs 152 and 153 that contact with the left and right side peripheries in an elastic manner. Accordingly, detachment thereof can be inhibited, and the respective electrode portions 34P and 34N of the lead electrodes 33P and 33N are fixed to the respective fixing portions 12P and 12N.

When the LED 3 is fixed in this manner, the left and right side peripheries of the respective electrode portions 34P and 34N of both the positive and negative side lead electrodes 33P and 33N are placed in elastic contact with the respective elastic contacting tabs 152 and 153. At the same time, the respective electrode portions 34P and 34N are placed in contact with the surfaces of the respective bus bars 11P and 11N, and electric connection is established. Thus, a required voltage supplied between the positive side bus bar 11P and the negative side bus bar 11N is supplied to the LED 3 via the lead electrodes 33P and 33N, whereby the LED 3 emits light.

When the fixed LED 3 is removed from the bus bar 11, the LED 3 is pulled in a perpendicular direction away from the surface of the bur bar 11. The left and right side peripheries of the respective electrode portions 34P and 34N of both lead electrodes 33P and 33N slide past the engagement portions 152b and 153b, while the elastic contacting tabs 152 and 153 elastically deform to the outside. Thus, it is possible to pull the electrode portions 34P and 34N upwards from the area surrounded by the pair of elastic contacting tabs 152 and 153 and the pair of position determining tabs 151 and 154. Accordingly, the fixed state of the LED 3 and the fixing portions 12P and 12N can be released.

In the second embodiment as well, the fixing portions 12P and 12N provided in the bus bars 11P and 11N are formed and configured from the cut and bent portions of the bus bars 11P and 11N. Accordingly, as with the first embodiment, a configuration with a minimal number of structural components can be provided. Further, when attaching and removing the LED 3, the operation is extremely simple since it is only necessary to push the LED 3 downwards towards or lift it upwards from the fixing portions 12P and 12N of the bus bars 11P and 11N in the perpendicular direction with respect to the surface of the bus bars 11P and 11N. Moreover, the electric connection of the bus bars 11P and 11N and the lead electrodes 33P and 33N is achieved through elastic contact of the left and right side peripheries of the electrode portions 34P and 34N and the elastic contacting tabs 152 and 153 in the plane direction. Accordingly, as compared to when the lower surfaces of the electrode portions 34P and 34N are in contact with the surfaces of the bus bars 11P and 11N, the contact pressure of the electrode portions 34P and 34N and the bus bars 11P and 11N is increased, whereby it is possible to reduce contact electrical resistance and obtain a favorable electric connection. In particular, the lead electrodes 33P and 33N have the electrode portions 34P and 34N formed with a broad width to facilitate heat dissipation. Accordingly, the lengths of the sides in the width direction of the electrode portions 34P and 34N are long, and thus the distance between the elastic contacting tabs 131 of the fixing portions 12P and 12N, which face each other, is large. This is favorable from the point of view of holding the electrode portions 34P and 34N stably in an elastic manner.

Figure 7:
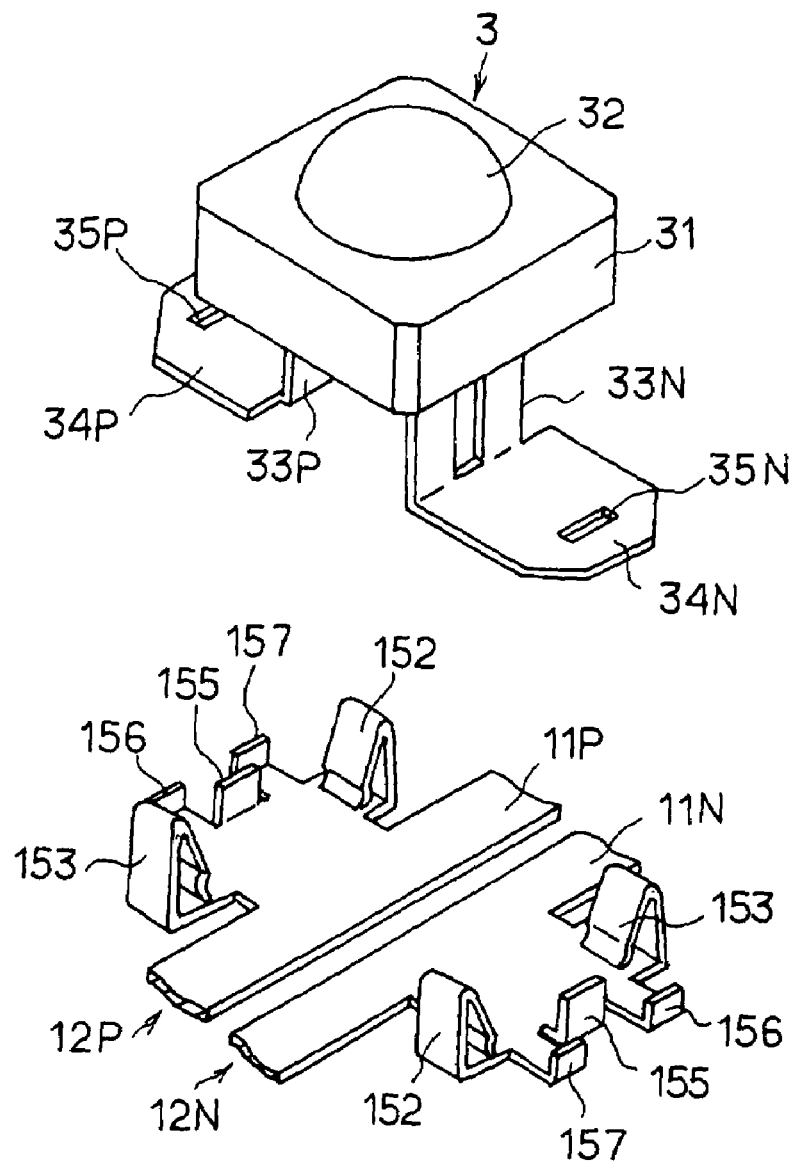
FIG. 7 is an exploded perspective view of a portion of a modified form of the second embodiment.

Note that, with the second embodiment as well, as shown in FIG. 7, rectangular thin grooves 35P and 35N may be formed in the electrode portions 34P and 34N of the lead electrodes 33P and 33N, and these thin grooves 35P and 35N may be fitted to position determining tabs 155 that are bent upwards from the bus bar 11P and 11N. Further, in this case, a pair of position determining tabs 156 and 157 for positioning may be bent upwards at either side of tip end peripheries of the electrode portions 34P and 34N. By adopting this configuration, it is possible to position the electrode portions 34P and 34N more securely. Note that, the pairs of elastic contacting tabs 152 and 153 are the same as those shown in the configuration of FIG. 6. The electrode portions 34P and 34N are interposed in a left-right direction between the pairs of elastic contacting tabs 152 and 153, and can be elastically held thereby.

Figure 8:
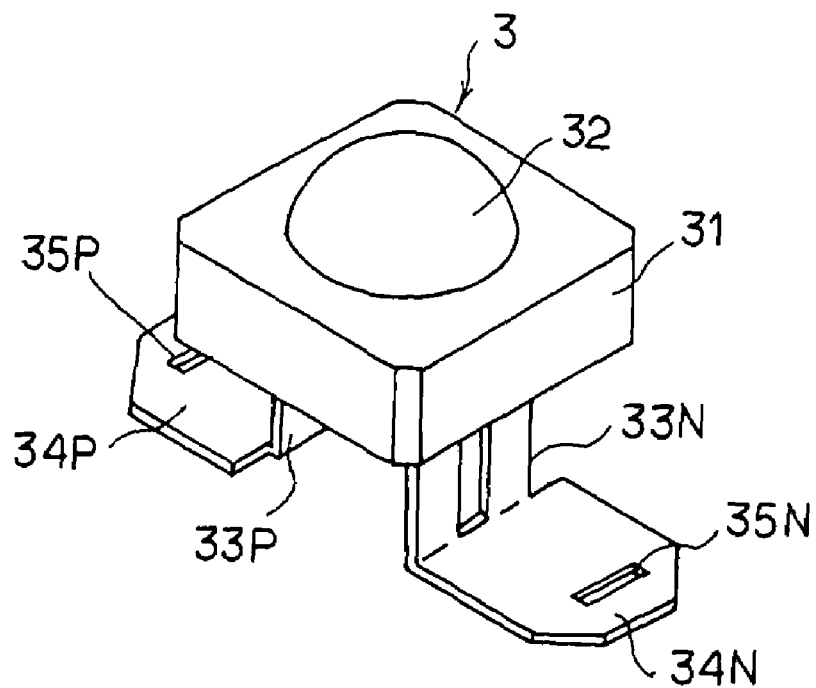
FIG. 8 is an exploded perspective view of a portion of another modified form of the second embodiment.
Figure 8:
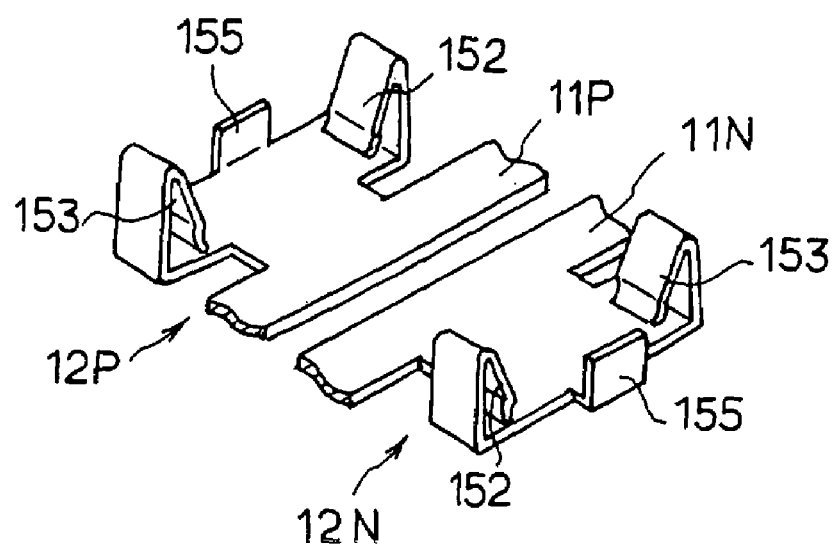

In addition, in this case, as shown in FIG. 8, it is possible to omit the position determining tabs 156 and 157 that abut with the tip end peripheries of the electrode portions 34P and 34N. By adopting this configuration, it is possible to position the electrode portions 34P and 34N in the plane direction using each single position determining tab 155. Further, it is possible to reduce the number of position determining tabs that need to be bent upwards from the bus bars 11P and 11N, and simplify the structure. Note that, the pair of elastic contacting tabs 152 and 153 are the same as those shown in the configuration of FIG. 7.

Figure 9:
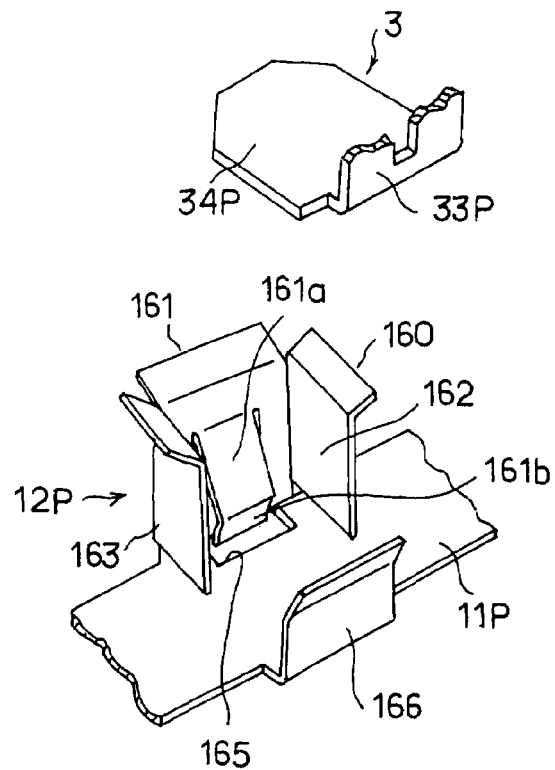
FIG. 9 is an exploded perspective view of a main portion of a third embodiment.

FIG. 9 is a perspective view of a fixing structure of a third embodiment. In this case, the figure shows the fixing portion 12P provided in the positive side bus bar 11P. Further, only the positive side lead electrode 33P of the LED 3, and the electrode portion 34P thereof are shown. In the third embodiment, a portion of the bus bar 11P is bent upwards and formed into a bent-up protruding tab 160 having a three dimensional shape that has standing walls with a U-like shape. Accordingly, the electrode portion 34P of the lead electrode 33P is sandwiched from three directions. The bent-up protruding tab 160 is formed from a central plate 161, and a right plate 162 and a left plate 163 on either side thereof. The right plate 162 and the left plate 163 abut respectively with the left and right side peripheries of the electrode portion 34P of the lead electrode 33P, and thereby act as position determining tabs. The center plate 161 is provided with a cut-out portion 165 which has a U-like shape and which faces upwards. A downward facing tongue-like tab 161a which is capable of elastic deformation along the surface of the bus bar 11P is formed using the cut-out portion 165. This tongue-like tab 161a acts as an elastic contacting tab, and the lower area thereof is formed as an engagement portion 161b that is bent in a taper shape that bends backwards to a certain extent. Moreover, a bent-up tab 166 that acts as a position determining tab is bent upwards so as to face the bent-up protruding tab 160, and abuts with the base end periphery of the electrode portion 34P.

In the third embodiment, when the LED 3 is fixed to the fixing portion 12P, the electrode portion 34P is positioned above the area surrounded by the bent-up protruding tab 160 and the bent-up tab 166, and is then pushed downwards in the perpendicular direction toward the surface of the bus bar 11P. The left and right side peripheries of the electrode portion 34P are positioned by the position determining tabs formed by the right tab 162 and the left tab 163, and the base end periphery is positioned by the position determining tab formed by the bent-up tab 166. Further, the tip end periphery of the electrode portion 34P is placed in elastic contact with the elastic contacting tab 161a formed by the tongue-like tab, and, in addition, abuts with the surface of the bus bar 11P while the elastic contacting tab 161a is elastically deformed. At this position, an engaged state is maintained in which the tip end periphery is engaged with the engagement portion 161b with the taper shape, and is held in an elastic manner at a position along the surface of the bus bar 11P.

When the fixed LED 3 is removed from the bus bar 11P, the LED 3 is lifted upwards from the surface of the bus bar 11P in the perpendicular direction. The tip end periphery of the electrode portion 34P of the lead electrode 33P moves over the engagement portion 161b while the elastic contacting tab 161a is elastically deformed to the outside. Accordingly, it is possible to lift the electrode portion 34P upwards from the area surrounded by the bent-up protruding tab 160 and the bent-up tab 166, and the fixed state of the LED 3 and the fixing portion 12P can be released. The above described structure is the same for the negative side bus bar 11N and the negative side lead electrode 33N that are omitted from the drawing and explanation.

In the third embodiment, the fixing portion 12P provided in the bus bar 11P is formed by bending upwards the portion of the bus bar 11P, whereby it is possible to provide a configuration with a minimal number of structural components. Further, when attaching and removing the LED 3, the operation is extremely simple since it is only necessary to push the LED 3 downwards towards or lift it upwards from the fixing portion 12P of the bus bar 11P in the perpendicular direction with respect to the surface of the bus bar 11P. Moreover, the electric connection of the bus bar 11P and the lead electrode 33P is achieved through elastic contact of the tip end periphery of the electrode portion 34P and the elastic contacting tab 161a in the plane direction. Accordingly, the contact pressure of the lead electrode 33P and the bus bar 11P is increased, whereby it is possible to reduce contact electrical resistance and obtain a favorable electric connection. Moreover, in the third embodiment, as compared to the first and second embodiments, it is possible to reduce the number of bent-up portions, whereby manufacture of the bus bar 11P is made easier. In addition, the elastic contacting tab 161a is configured from the tongue-like tab, and thus the dimensions of the elastic contacting tab in the elastic deformation direction can be made smaller.

Figure 10:
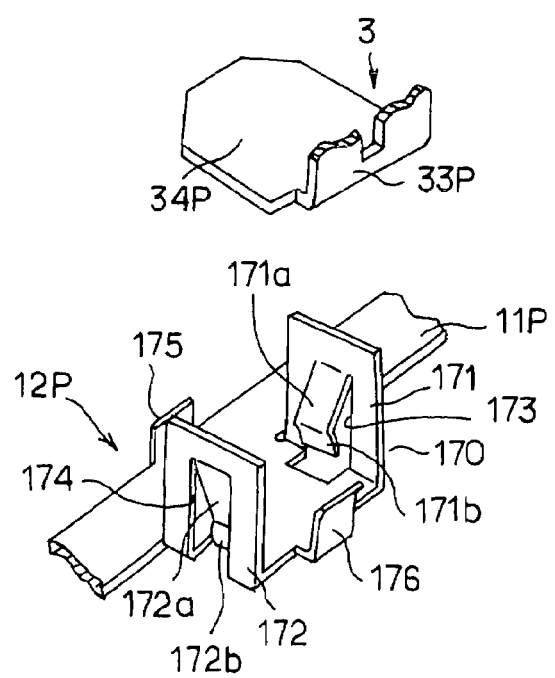
FIG. 10 is an exploded perspective view of a main portion of a fourth embodiment

FIG. 10 shows a fixing structure according to a fourth embodiment. As in the third embodiment, the figure shows the fixing portion 12P provided on the positive side bus bar 11P, and the positive side lead electrode 33P. In the fourth embodiment, an upward facing bent-up protruding tab 170 having a U-shape is formed in the positive side bus bar 11P. This bent-up protruding tab 170 is configured from a pair of left and right bent-up tabs 171 and 172 which face each other, and which sandwich the electrode portion 34P of the positive side lead electrode 33P from the left and right directions. The left and right bent-up tabs 171 and 172 are provided with respective upward facing cut-out portions 173 and 174 that have a U-shape. The cut-out portions 173 and 174 are used to form downward facing tongue-like tabs 171a and 172a that are capable of elastic deformation along the surface of the bus bar 11P. These tongue-like tabs 171a and 172a act as elastic contacting tabs, and have lower areas provided with engagement portions 171b and 172b that are bent in a taper shape that bends backwards to a certain extent. Moreover, position determining tabs 175 and 176 for positioning are bent upwards from the positive side bus bar 11P and abut respectively with the tip end periphery and the base end periphery of the electrode portion 34P of the positive side lead electrode 33P that is sandwiched by the left and right bent-up tabs 171 and 172.

With the fourth embodiment, when the LED 3 is fixed to the fixing portion 12P, the electrode portion 34P is positioned so as to be sandwiched between the left and right bent-up tabs 171 and 172 and the respective position determining tabs 175 and 176 at the tip end periphery and the base end periphery, and is then pushed downward in the perpendicular direction from the surface side of the bus bar 11P. Accordingly, the tip end periphery and the base end periphery of the electrode portion 34P abut respectively against the position determining tabs 175 and 176, whereby the electrode portion 34P is positioned. Moreover, the left and right side peripheries of the electrode portion 34P are placed in elastic contact with the elastic contacting tabs 171a and 172a formed by the tongue-like tabs provided on the left and right bent-up tabs 171 and 172. Further, the elastic contacting tabs 171a and 172a abut against the surface of the bus bar 11P while the elastic contacting tabs 171a and 172a elastically deform. At this position, the left and right side peripheries engage with the taper-shaped engagement portions 171b and 172b, and are held in an elastic manner at a position along the surface of the bus bar 11P.

When the fixed LED 3 is removed from the bus bar 11P, the LED 3 is lifted upwards from the surface of the bus bar 11P in the perpendicular direction. The left and right side peripheries of the electrode portion 34P of the lead electrode 33P slide past the engagement portions 171b and 172b while the elastic contacting tabs 171a and 172a are elastically deformed to the outside. Accordingly, it is possible to lift the electrode portion 34P upwards from the area surrounded by the bent-up protruding tab 170, and the fixed state of the LED 3 and the fixing portion 12P can be released. The above described structure is the same for the negative side bus bar 11N and the negative side lead electrode 33N that are omitted from the drawing and explanation.

In the fourth embodiment, the fixing portion 12P provided in the bus bar 11P is formed by cutting and bending upwards the portion of the bus bar 11P. Thus, it is possible to provide a configuration with a minimal number of structural components. Further, when attaching and removing the LED 3, the operation is extremely simple since it is only necessary to push the LED 3 downwards toward or lift it upwards from the fixing portion 12P of the bus bar 11P in the perpendicular direction with respect to the surface of the bus bar 11P. Moreover, the electric connection of the bus bar 11P and the lead electrode 33P is achieved through elastic contact of the left and right side peripheries of the electrode portion 34P and the elastic contacting tabs 171a and 172a in the plane direction. Accordingly, the contact pressure of the lead electrode 33P and the bus bar 11P is increased, whereby it is possible to reduce contact electrical resistance and obtain a favorable electric connection. Moreover, the elastic contacting tabs 171a and 172b are configured from the tongue-like tabs, and thus the dimensions of the elastic contacting tabs in the elastic deformation direction can be made smaller.

Figure 11:
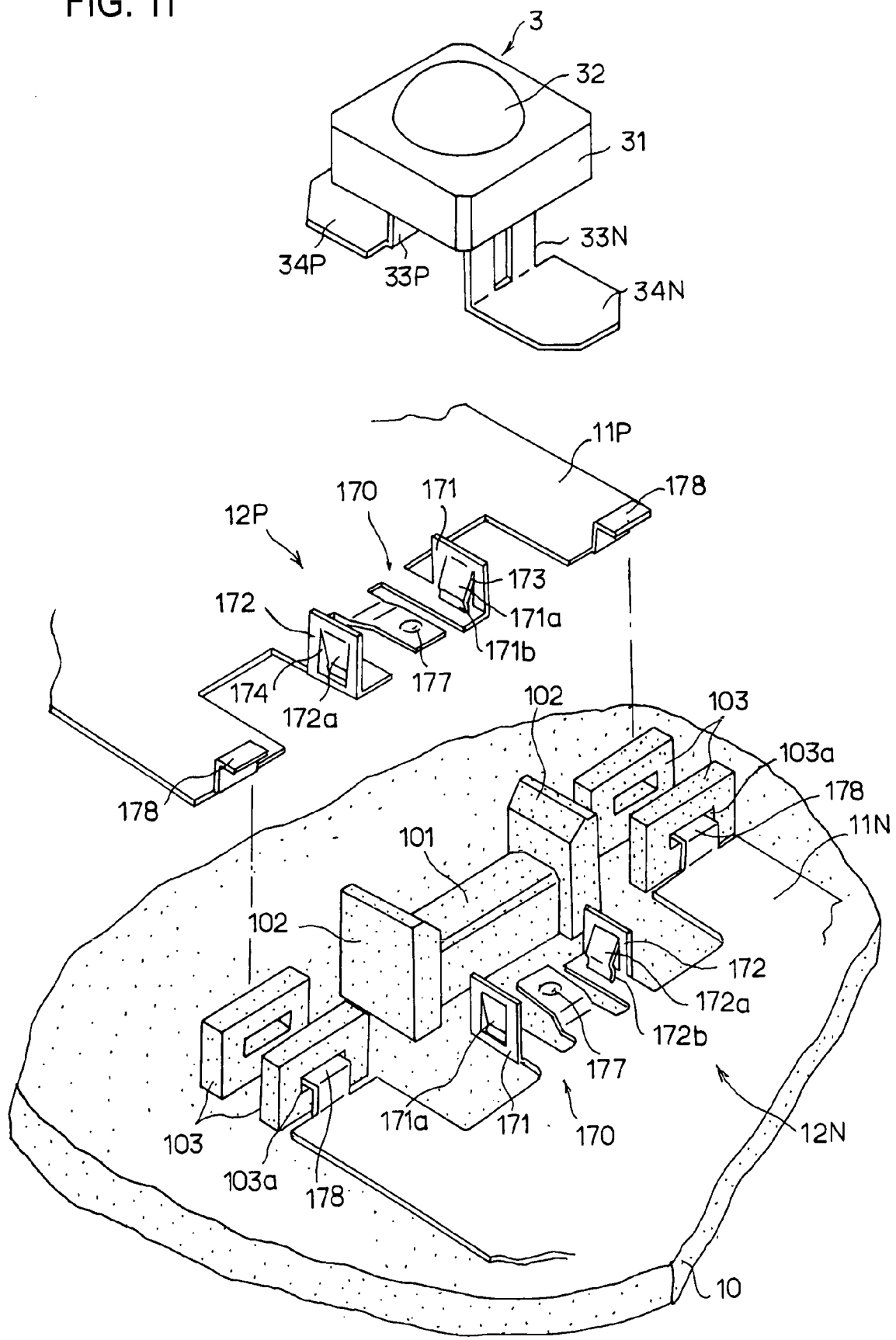
FIG. 11 is an exploded perspective view of a main portion of a fifth embodiment

FIG. 11 shows a fixing structure of a fifth embodiment. In the shown embodiment, positioning of the LED 3 is performed using the base instead the bus bar. As in the first to fourth embodiments, the positive side bus bar 11P and the negative side bus bar 11N are supported on the circular base 10, as shown in FIG. 1. However, a bearing rib 101 is formed to protrude outwards from the circular base 10 at a position that is interposed between both bus bars 11P and 11N. The bearing rib 101 abuts with the lower surface of the package 31 of the LED 3 to provide support therefore, and is also interposed between both lead electrodes 33P and 33N so as to position the lead electrodes 33P and 33N in the protrusion direction. Further, a pair of end ribs 102 are integrally formed at both ends of the bearing rib 101, and fix the positions of both ends of the package 31 of the LED 3. In addition, standing fixing ribs 103 for fixing the respective positive side bus bar 11P and the negative side bus bar 11N are formed at both outer sides of the pair of ribs 102.

The fixing portion 12P of the positive side bus bar 11P is configured to be substantially the same as the fixing portion of the fourth embodiment. More particularly, referring to the same reference numerals as in the fourth embodiment, the fixing portion 12P of the positive side bus bar 11P is formed with the upward facing bent-up protruding tab 170. The mutually facing left and right pair of bent-up tabs 171 and 172 that configure the bent-up protruding tab 170 sandwich the electrode portion 34P of the positive side lead electrode 33P from the left and right directions. The left and right bent-up tabs 171 and 172 are provided with the respective upward facing U-shaped cut-out portions 173 and 174, and these cut-out portions 173 and 174 are used to form the downward facing tongue-like tabs 171a and 172a that are capable of elastic deformation along the surface of the bus bar 11P. The tongue-like tabs 171a and 172a are configured as elastic contacting tabs, and the engagement portions 171b and 172b bent with the taper shape that bends backwards to a certain extent are provided at the lower areas thereof. Further, a tongue-like shape surface contacting tab 177 is formed in the positive side bus bar 11P at a position interposed between the left and right bent-up tabs 171 and 172, and is bent in the plate thickness direction to face upwards by just a small amount. Moreover, the positive side bus bar 11P is machine bent to have inverted L-shaped engagement tabs 178 that face upwards at positions to both outer sides of the bent-up tabs 171 and 172. These engagement tabs 178 are inserted within respective engagement grooves 103a provided in the fixing ribs 103 provided on the circular base 10. Accordingly, this inserting-fixing structure is used to fix the positive side bus bar 11P to the circular base 10. The structure used for the negative side bus bar 11N is the same, and thus the same reference numerals are attached and a repeated explanation will be omitted here. Note that, although omitted from the drawing, another engagement tab separate from the engagement tab 178 may be provided in each of the bus bars 11P and 11N, and this engagement tab may be used for engagement with the circular base 10. Accordingly, it is possible to promote stable fixing of the bus bars 11P and 11N. Alternatively, as shown in FIG. 1, the screws 4 may be used for fixing.

Figure 12:
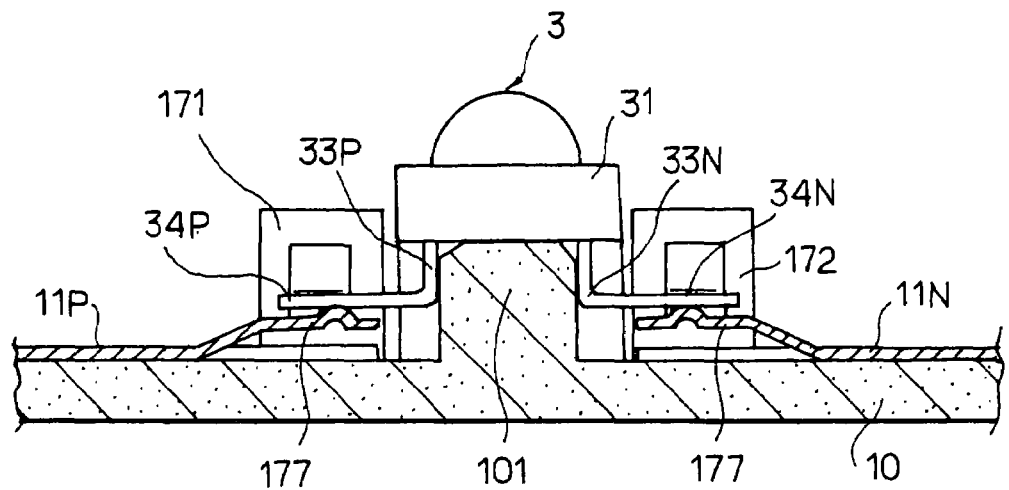
FIG. 12 is a cross section view of the fifth embodiment in a fixed state.

In the fifth embodiment, when the LED 3 is fixed to the fixing portions 12P and 12N, the LED 3 is mounted on the lamp base 1 such that the lead electrodes 33P and 33N straddle over the bearing rib 101 of the circular base 10, as shown in the cross section view of FIG. 12. The bearing ribs 10 are sandwiched from both sides by the pair of lead electrodes 33P and 33N, whereby positioning of the lead electrodes 33P and 33N in the protrusion direction is performed. At this time, both ends of the package 31 are sandwiched between the end ribs 102, and thus the lead electrodes 33P and 33N are positioned in the width direction. In this manner, the LED 3 is positioned in the plane direction. Further, at the same time, the electrode portions 34P and 34N of the lead electrodes 33P and 33N are pushed in the perpendicular direction while sandwiched by the left and right bent-up tabs 171 and 172. Thus, the left and right side peripheries of the electrode portions 34P and 34N are placed in elastic contact with the elastic contacting tabs 171a and 172a formed from the tongue-like tabs provided on the bent-up tabs 171 and 172. Further, the elastic contacting tabs 171a and 172a are elastically deformed, and the left and right side peripheries abut with the taper shaped engagement portions 171b and 172b at this position. Moreover, in this state, the base surfaces of the electrode portions 34P and 34N are placed in elastic contact with the respective surface contacting tabs 177 of the respective bus bars 11P and 11N by the elastic deformation force thereof. When the fixed LED 3 is removed from the bus bars 11P and 11N, the operation is exactly the same as that in the fourth embodiment, and thus an explanation will be omitted.

In the fifth embodiment, the fixing portions 12P and 12N provided in the bus bars 11P and 11N are formed and configured by cutting and bending upwards the portions of the bus bars 11P and 11N. Thus, it is possible to provide a configuration with a minimal number of structural components. Further, when attaching and removing the LED 3, the operation is extremely simple since it is only necessary to push the LED 3 downwards toward or lift it upwards from the fixing portions 12P and 12N of the bus bars 11P and 11N in the perpendicular direction with respect to the surface of the bus bars 11P and 11N. Moreover, the electric connection of the bus bars 11P and 11N and the lead electrodes 33P and 33N is achieved through elastic contact of the left and right side peripheries of the electrode portions 34P and 34N and the elastic contacting tabs 171*a* and 172*a* in the plane direction. Accordingly, the contact pressure of the lead electrodes 33P and 33N and the bus bars 11P and 11N is increased, whereby it is possible to reduce contact electrical resistance and obtain a favorable electric connection. Moreover, electric connection is also established by the bottom surface of the electrode portions 34P and 34N being placed in elastic contact with the surface contacting tabs 177, and thus it is possible to reduce electric resistance.

In the fifth embodiment, the LED 3 is positioned by the bearing rib 101 and the end ribs 102 provided on the circular base 10. These ribs 101 and 102 can be integrally formed by plastic molding with the circular base 10, and thus the manufacturing method is simple. Further, it is not necessary for the tabs for positioning to be bent upwards or cut from the bus bars 11P and 11N. Accordingly, the manufacturing method for the bus bars 11P and 11N is simple.

The structure of the fixing portion according to the present invention is not limited to the structures of the first to fifth embodiments. Accordingly, the present invention may be realized by appropriately modifying the structures of the first to fifth embodiments, so long as the structure enables the electrode portions of the lead electrodes to be positioned and the electrode portions to be held by elastic force while electric connection is established by inserting the LED toward the surface of bus bars in the perpendicular direction.

Moreover, the light-emitting device according to the present invention is not limited to an LED. Accordingly, it is possible to apply the present invention in a similar manner so long as the utilized device is provided with lead electrodes, like an organic light emitting device or a laser light emitting device, and the lead electrodes are used to mechanically perform fixing while at the same time establishing electric connection.

Other implementations or embodiments are within the scope of the following claims.

What is claimed is:

1. An apparatus comprising a fixing structure for a light emitting device provided with bus bars formed from conductive plate material connected to a power source, and an electron device which has lead electrodes fixed to the bus bars and which is supplied with electricity via the bus bars, wherein the lead electrodes have electrode portions that bend in an outwardly planar direction and have an enlarged width dimension, and wherein fixing portions of the bus bars are provided with elastic contacting tabs formed by bending portions of the bus bars, the elastic contacting tabs contacting elastically and engaging with the lead electrodes so as to elastically hold the electrode portions, and enabling the lead electrodes to be attached to surfaces of the bus bars from a perpendicular direction.

2. The apparatus according to claim 1, wherein position determining tabs for positioning the lead electrodes are formed in the bus bars.

3. The apparatus according to claim 1, wherein the bus bars are fixed and supported on an insulated base which is provided with ribs to position the lead electrodes on the insulated base.

4. The apparatus according to claim 2, wherein the elastic contacting tabs are in elastic contact with one periphery portion of the electrode portions, and the electrode portions are sandwiched between the elastic contacting tabs and the position determining tabs.

5. The apparatus according to claim 1, wherein the elastic contacting tabs elastically contact the electrode portions at facing periphery portions thereof such that the electrode portions are sandwiched between the elastic contacting tabs.

6. The apparatus according to claim 1, wherein the elastic contacting tabs elastically contact the electrode portions at facing periphery portions thereof such that the electrode portions are sandwiched between the elastic contacting tabs.

7. The apparatus according to claim 2, wherein the elastic contacting tabs elastically contact the electrode portions at facing periphery portions thereof such that the electrode portions are sandwiched between the elastic contacting tabs.

8. The apparatus according to claim 3, wherein the elastic contacting tabs elastically contact the electrode portions at facing periphery portions thereof such that the electrode portions are sandwiched between the elastic contacting tabs.

* * * * *